United States Patent
Ho et al.

(10) Patent No.: US 11,212,922 B2
(45) Date of Patent: Dec. 28, 2021

(54) CIRCUIT BOARD AND MANUFACTURING METHOD THEREOF

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Ming-Jaan Ho, New Taipei (TW); Xian-Qin Hu, Shenzhen (CN); Fu-Yun Shen, Shenzhen (CN); Hsiao-Ting Hsu, New Taipei (TW); Yong-Chao Wei, Qinhuangdao (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/767,870

(22) PCT Filed: Apr. 23, 2019

(86) PCT No.: PCT/CN2019/083965
§ 371 (c)(1),
(2) Date: May 28, 2020

(87) PCT Pub. No.: WO2020/215225
PCT Pub. Date: Oct. 29, 2020

(65) Prior Publication Data
US 2021/0235590 A1    Jul. 29, 2021

(51) Int. Cl.
*H05K 1/02* (2006.01)
*H05K 3/04* (2006.01)
(Continued)

(52) U.S. Cl.
CPC .......... *H05K 3/4644* (2013.01); *H05K 1/111* (2013.01); *H05K 3/04* (2013.01); *H05K 3/107* (2013.01);
(Continued)

(58) Field of Classification Search
CPC .......... H05K 1/02; H05K 1/111; H05K 1/112; H05K 1/162; H05K 3/04; H05K 3/46;
(Continued)

(56) References Cited

U.S. PATENT DOCUMENTS

| 6,103,591 | A  | * | 8/2000 | Kagamihara | ....... H01L 23/5222 |
|           |    |   |        |            | 257/E23.144           |
| 6,229,195 | B1 | * | 5/2001 | Kagamihara | ....... H01L 23/5222 |
|           |    |   |        |            | 257/522               |

(Continued)

FOREIGN PATENT DOCUMENTS

| CN | 1420715 A   | 5/2003 |
| CN | 105393346 A | 3/2016 |

*Primary Examiner* — Xiaoliang Chen
(74) *Attorney, Agent, or Firm* — ScienBiziP, P.C.

(57) ABSTRACT

The disclosure provides a method for manufacturing a circuit board, which includes: (1) providing a substrate, forming a through hole in the substrate; (2) filling the through hole with a conductor to form a conductive hole; (3) providing a peelable film to cover the substrate; (4) forming a groove by laser, the groove including a concave portion; (5) performing a surface treatment on a wall of the groove; (6) removing the peelable film; (7) forming a seed layer; (8) making a circuit layer to obtain a circuit board unit, the circuit layer including a connection pad, the connection pad shaped as a conductive protrusion which surrounds and is electrically connected to the conductor; (9) repeating step (1) to step (8) at least once; and (10) laminating the circuit board units. The disclosure also provides a circuit board.

5 Claims, 5 Drawing Sheets

(51) Int. Cl.
*H05K 3/46* (2006.01)
*H05K 1/11* (2006.01)
*H05K 3/10* (2006.01)

(52) U.S. Cl.
CPC ... *H05K 3/4614* (2013.01); *H05K 2201/0394* (2013.01); *H05K 2201/09563* (2013.01)

(58) Field of Classification Search
CPC ........ H05K 3/107; H05K 3/184; H05K 3/465; H05K 3/1031; H05K 3/4614; H05K 3/4644; H05K 2201/0394; H05K 2201/09563; H01L 21/76807; H01L 21/7682; H01L 21/76898
USPC .......... 174/262, 250, 255, 258; 29/832, 846, 29/852; 427/8, 555, 97.3
See application file for complete search history.

(56) References Cited

U.S. PATENT DOCUMENTS

| | | | |
|---|---|---|---|
| 10,559,525 B2* | 2/2020 | Yu ........................ | H01L 23/147 |
| 2004/0119166 A1* | 6/2004 | Sunohara ............ | H01L 21/6835 |
| | | | 257/758 |
| 2004/0134682 A1* | 7/2004 | En .......................... | C25D 5/34 |
| | | | 174/258 |
| 2004/0154163 A1* | 8/2004 | Miyazaki ................ | H01L 24/19 |
| | | | 29/832 |
| 2007/0163887 A1* | 7/2007 | Hofmann ................ | H05K 3/465 |
| | | | 205/80 |
| 2009/0053459 A1* | 2/2009 | Hirose ................... | H05K 1/112 |
| | | | 428/76 |
| 2009/0272564 A1* | 11/2009 | Yoshioka ............... | H05K 1/162 |
| | | | 174/255 |
| 2011/0247860 A1* | 10/2011 | Yoshioka ............... | H05K 3/184 |
| | | | 174/250 |

* cited by examiner

CIRCUIT BOARD AND MANUFACTURING METHOD THEREOF

FIELD

The disclosure relates to a circuit board and a manufacturing method thereof.

BACKGROUND

As the frequency of signal transmission and the number of input/output interfaces increase, higher requirements are placed on the signal transmission loss of the circuit board and the reliability of the circuit layer. In the traditional circuit layer manufacturing method, the subtractive method and the improved semi-additive method have poor ability to produce fine circuit layers, and the cost of the semi-additive method is high.

SUMMARY OF THE DISCLOSURE

In view of the above, it is necessary to provide a circuit board and a manufacturing method thereof to solve the above problems.

A circuit board manufacturing method includes the following steps:

(1) Provide a substrate, and make a hole in the substrate to form a through hole;

(2) Fill the through hole with a conductor to form a conductive hole;

(3) Provide a peelable film to cover one side of the substrate;

(4) Form a groove in the peelable film and the substrate by laser ablation, the groove includes a concave portion, the concave portion is located at the conductive hole, and the diameter of the concave portion is larger than the diameter of the conductive hole to expose a portion of the conductor;

(5) Perform a surface treatment on a side wall and bottom wall of the groove to improve roughness;

(6) Remove the peelable film;

(7) Form a seed layer on the side wall and bottom wall of the groove;

(8) Make a circuit layer in the groove to obtain a circuit board unit, the circuit layer includes a connection pad located in the concave portion, the connection pad is shaped as a conductive protrusion which surrounds and is electrically connected to the conductor;

(9) Repeat step (1) to step (8) at least once; and

(10) Laminate the at least two of the circuit board units.

Further, in step (5), the side wall and bottom wall of the groove are processed by a plasma surface treatment machine.

Further, in step (7), the seed layer is formed by chemical vapor deposition or physical vapor deposition.

Further, after step (8) and before step (9), the method further includes the steps of: forming a metallization layer on the surface of the circuit layer.

Further, in step (1), one side of the substrate is connected to a carrier board through a separable film.

A circuit board includes at least two stacked circuit board units, and each of the circuit board units includes a substrate and a circuit layer. The substrate is provided with a conductive hole, and a conductor is provided in the conductive hole. A groove is provided on one side of the substrate. The groove includes a concave portion. The concave portion is located at the conductive hole, and the diameter of the concave portion is larger than the diameter of the conductive hole to expose a portion of the conductor. The circuit layer includes a connection pad located in the concave portion, and the connection pad is shaped as a conductive protrusion which surrounds and is electrically connected to the conductor. The circuit layer is located in the groove, and the conductive hole electrically connects the circuit layers of two adjacent circuit board units.

Further, a metallization layer is provided on the surface of the circuit layer.

A circuit board manufacturing method includes the following steps:

Providing a substrate, and opening a hole in the substrate to form a through hole;

Filling the through hole with a conductor to form a conductive hole;

Providing two peelable films covering opposite sides of the substrate, respectively;

Forming grooves in the two peelable films and two sides of the substrate by laser ablation, each groove including a concave portion, the concave portion located at the conductive hole, and the diameter of the concave portion larger than the diameter of the conductive hole to expose a portion of the conductor;

Performing a surface treatment on a side wall and a bottom wall of each of the two grooves to improve roughness;

Removing the two peelable films;

Forming a seed layer on the side wall and the bottom wall of each of the two grooves;

Forming a circuit layer in each of the two grooves to obtain a circuit board, the circuit layer including a connection pad in the concave portion, the connection pad shaped as a conductive protrusion which surrounds and is electrically connected to the conductor.

A circuit board includes a substrate and two circuit layers. The substrate is provided with a conductive hole. The conductive hole is provided with a conductor. The substrate is provided with a groove on both sides, and each of the two circuit layers is respectively provided in the corresponding one of the two grooves. The groove includes a concave portion. The concave portion is located at the conductive hole, and the diameter of the concave portion is larger than the diameter of the conductive hole to expose a portion of the conductor. The circuit layer includes a connection pad located in the concave portion. The connection pad is shaped as a conductive protrusion, and the conductive hole electrically connects the two circuit layers. The manufacturing method of the circuit board of the present disclosure is relatively simple and the manufacturing cost is low. The circuit of the manufactured circuit board is formed in the groove, and the groove is formed by laser ablation. Therefore, the line width of the circuit layer is stable and the precision is high. The connection pad of the circuit board of the present disclosure is a conductive protrusion to improve the conductive yield.

SYMBOL DESCRIPTION OF MAIN COMPONENTS

Figure 1:
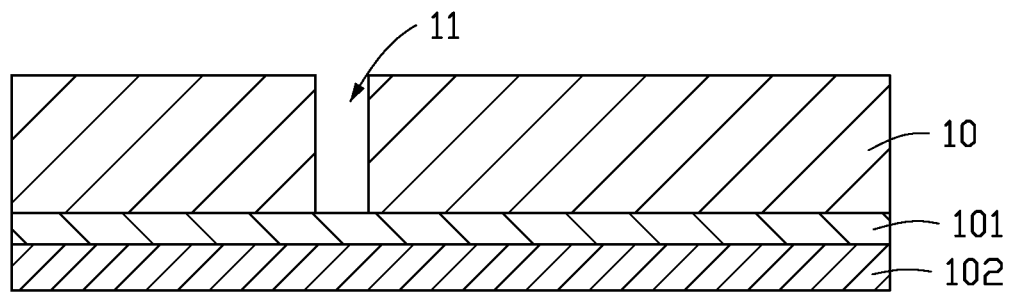
FIG. 1 is a cross-sectional view of a through hole formed in a substrate according to a first embodiment of the present disclosure.

Circuit board 200, 300
Circuit board unit 100
Substrate 10
Separable film 101
Carrier board 102
Through hole 11
Conductor 111
Conductive hole 12
Peelable film 13
Groove 15
Concave portion 151
Seed layer 16
Circuit layer 20
Connection pad 21
Metallization layer 22

The following specific embodiments will further illustrate the present disclosure with reference to the above drawings. The technical solutions in the embodiments of the present disclosure will be described clearly and completely in conjunction with the drawings in the embodiments of the present disclosure. Obviously, the described embodiments are only a part of the embodiments of the present disclosure, not all of them. Based on the embodiments of the present disclosure, all other embodiments obtained by a person of ordinary skill in the art without creative work fall within the protection scope of the present disclosure.

It should be noted that when an element is considered to be "connected" to another element, it may be directly connected to another element or there may be an element that is centrally located at the same time. When an element is considered to be "provided on" another element, it may be placed directly on another element or there may be an element placed in the middle at the same time.

Unless otherwise defined, all technical and scientific terms used herein have the same meaning as commonly understood by those skilled in the technical field of the present disclosure. The terminology used in the description of the present disclosure herein is for the purpose of describing specific embodiments, and is not intended to limit the present disclosure. The term "and/or" as used herein includes any and all combinations of one or more related listed items.

FIGS. 1 to 10 refer to a first embodiment of the present disclosure of a method for manufacturing a circuit board, the method includes the following steps.

In the first step, referring to FIG. 1, a substrate 10 is provided, and a hole is formed in the substrate 10 to form a through hole 11.

In this embodiment, one side of the substrate 10 is connected to a carrier board 102 through a separable film 101 to facilitate processing, but it is not limited to this. In other embodiments, the separable film 101 and the carrier board 102 may be omitted. The substrate 10 is a low dielectric resin material, preferably a polyester polymer base material or a polyether polymer base material, such as polyether ether ketone (PEEK), liquid crystal polymer (LCP), etc.

In this embodiment, the through hole 11 is formed by laser processing. It can be understood that, in other examples, the through hole 11 may also be formed by mechanical processing.

Figure 2:
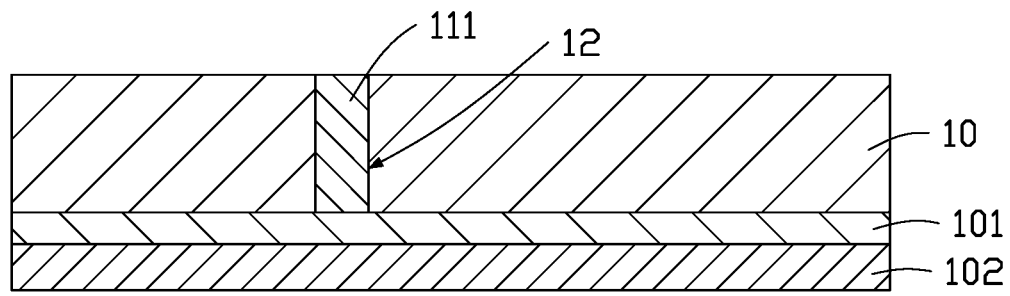
FIG. 2 is a cross-sectional view of the through hole of the structure shown in FIG. 1 filled with a conductor.

In the second step, referring to FIG. 2, the through hole 11 is filled with a conductor 111 to form a conductive hole 12.

The conductor 111 is a conductive material such as conductive paste.

Figure 3:
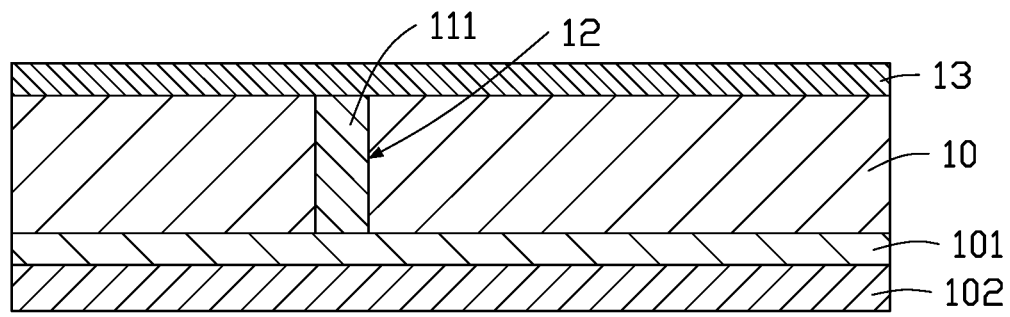
FIG. 3 is a cross-sectional view of the structure shown in FIG. 2 covered with a peelable film.

In the third step, referring to FIG. 3, a peelable film 13 is provided for covering one side of the substrate 10.

In this embodiment, the peelable film 13 covers the side of the substrate 10 facing away from the carrier board 102.

The peelable film 13 is a resin material such as polyimide (PI), polyethylene terephthalate (PET), polyethylene naphthalate (PEN), etc.

Figure 4:
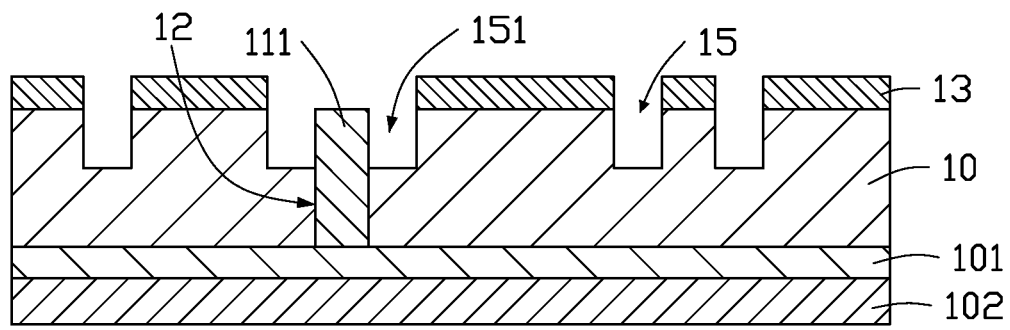
FIG. 4 is a cross-sectional view of a groove formed in the peelable film and a cover layer of the structure shown in FIG. 3.

In the fourth step, referring to FIG. 4, a groove 15 is formed in the peelable film 13 and the substrate 10 by laser ablation.

The groove 15 includes a concave portion 151. The concave portion 151 is located at the conductive hole 12, and the diameter of the concave portion 151 is larger than the diameter of the conductive hole 12 to expose a portion of the conductor 111.

The groove 15 is formed by laser ablation to accurately control the line width and stability and facilitate the impedance control tolerance. An excimer laser is preferably used to finely adjust the opening size of the groove 15.

In the fifth step, a surface treatment is performed on a side wall and a bottom wall of the groove 15 to increase roughness.

In this embodiment, the side wall and the bottom wall of the groove 15 are processed by a plasma surface treatment machine to remove residue formed from laser ablation and improve the roughness and an activating effect.

It can be understood that, in other embodiments, sandblasting may also be performed.

Figure 5:
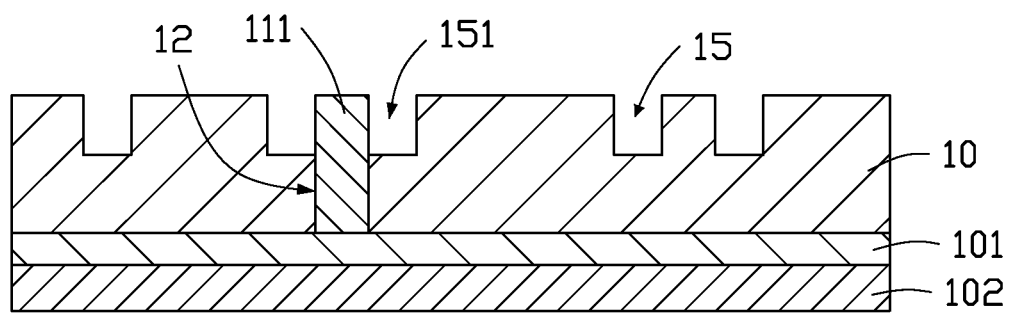
FIG. 5 is a cross-sectional view of the structure shown in FIG. 4 with the peelable film removed.

In the sixth step, referring to FIG. 5, the peelable film 13 is removed.

Figure 6:
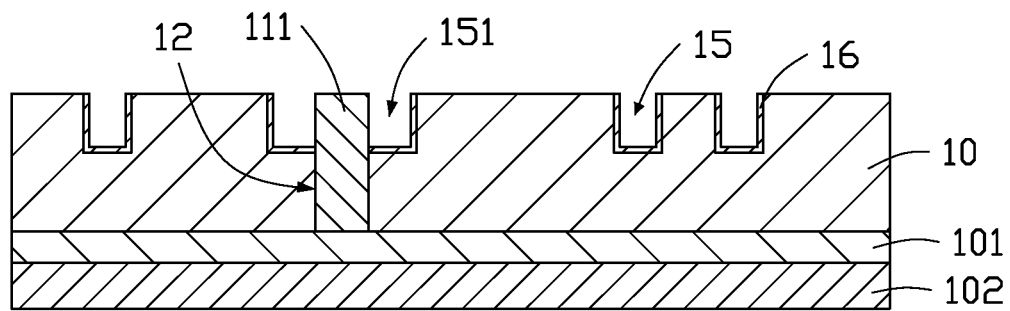
FIG. 6 is a cross-sectional view of a seed layer formed in the groove of the structure shown in FIG. 5.

In the seventh step, referring to FIG. 6, a seed layer 16 is formed on the side wall and the bottom wall of the groove 15.

In the present embodiment, the seed layer 16 is formed by chemical vapor deposition (CVD) or physical vapor deposition (PVD). The thickness of the seed layer 16 ranges from 0.08 microns to 2 microns. The seed layer 16 may be made of nickel, copper, gold, graphite, titanium, silver, or other materials.

Since the side wall and the bottom wall of the groove 15 have high roughness, it is easy to form the seed layer 16, while it is difficult to form the seed layer 16 on other parts.

Figure 7:
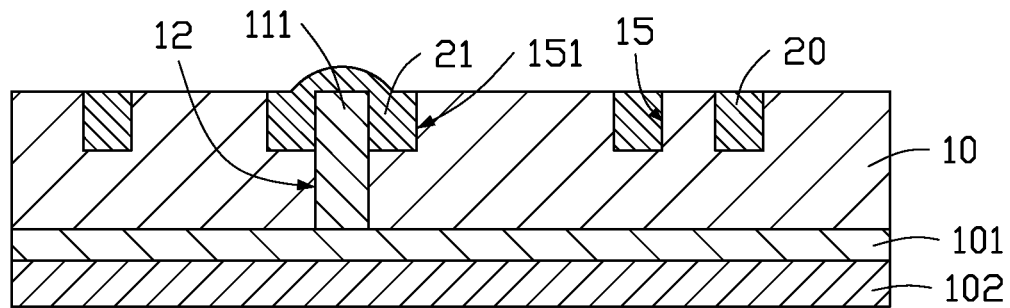
FIG. 7 is a cross-sectional view of a circuit layer formed in the groove of the structure shown in FIG. 6.

In the eighth step, referring to FIG. 7, a circuit layer 20 is formed in the groove 15 to obtain a circuit board unit 100.

The circuit layer 20 includes a connection pad 21 formed in the concave portion 151. The shape of the connection pad 21 is a conductive protrusion, which surrounds and is electrically connected to the conductor 111.

The circuit layer 20 can be formed by chemical plating, electroplating, sputtering, ion plating, or the like. It can be understood that during plating, the circuit layer 20 is connected to the plating power source by adding leads.

Figure 8:
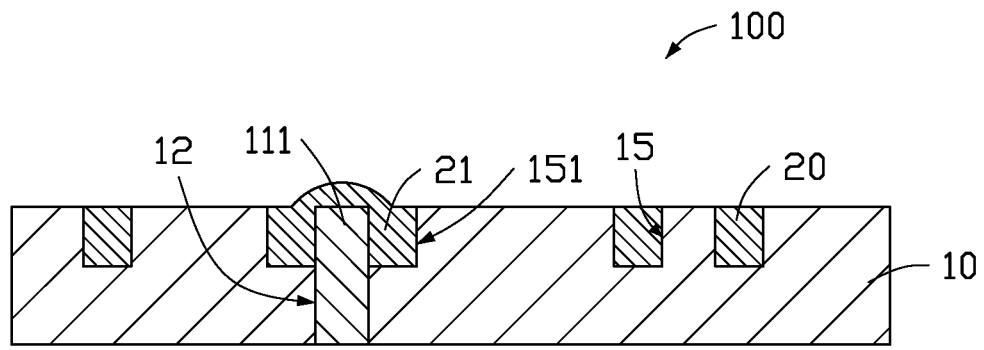
FIG. 8 is a cross-sectional view of the structure shown in FIG. 7 with a separable film and a carrier board removed.

In the ninth step, referring to FIG. 8, the separable film 101 and the carrier board 102 are removed.

It can be understood that in other embodiments, if the separable film 101 and the carrier board 102 are omitted, the ninth step is omitted.

Figure 9:
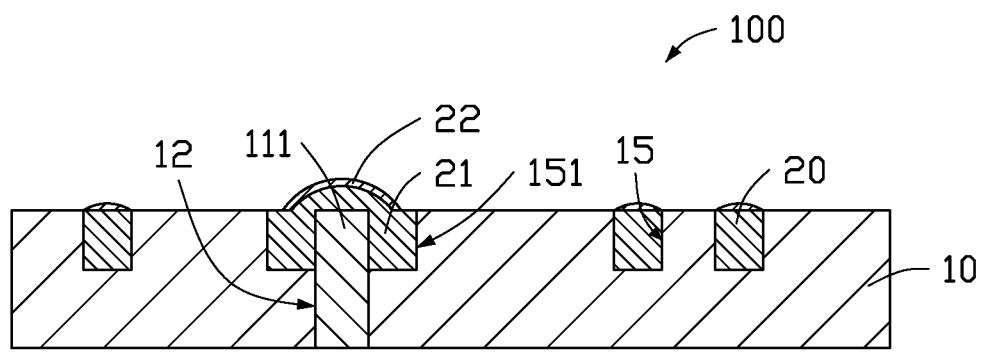
FIG. 9 is a cross-sectional view of a metallization layer formed on the circuit layer of the structure shown in FIG. 8.

In the tenth step, referring to FIG. 9, a metallization layer 22 is formed on the surface of the circuit layer 20. The metallization layer 22 is formed by tin (immersion tin). In other embodiments, it may also be silver or other soft metals. The metallization layer 22 is used to ensure the reliability of electrical conduction of multiple layers of the circuit board units 100 in subsequent steps. It can be understood that in other embodiments, the tenth step may be omitted.

In the eleventh step, the first through tenth steps are repeated at least once.

Figure 10:
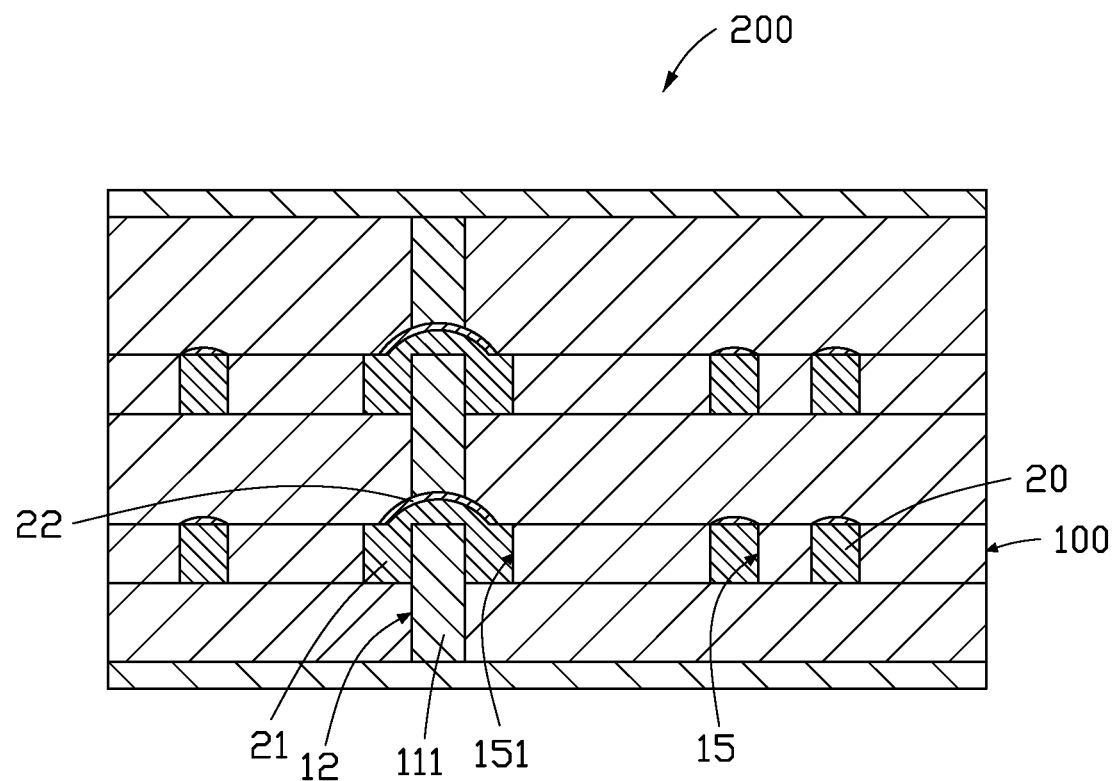
FIG. 10 is a cross-sectional view of a circuit board according to the first embodiment and a third embodiment of the present disclosure.

In the twelfth step, referring to FIG. 10, at least two of the circuit board units 100 are laminated to obtain the circuit board 200.

Figure 11:
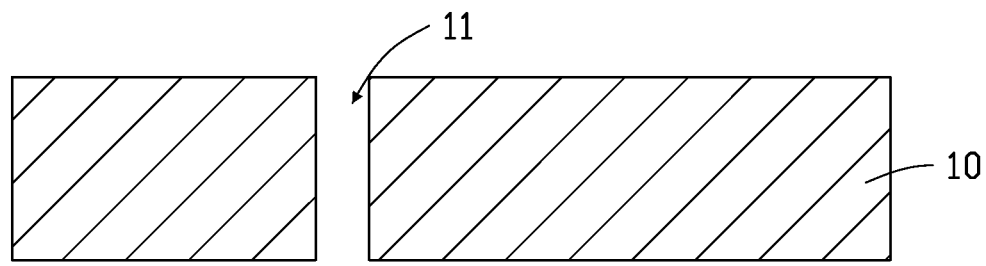
FIG. 11 is a cross-sectional view of a through hole formed in a substrate according to a second embodiment of the present disclosure.
Figure 12:
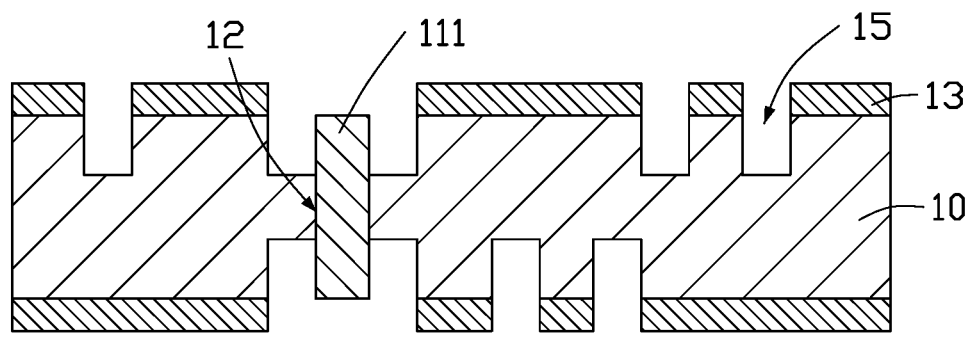
FIG. 12 is a cross-sectional view of the structure shown in FIG. 11 after a groove is formed.
Figure 13:
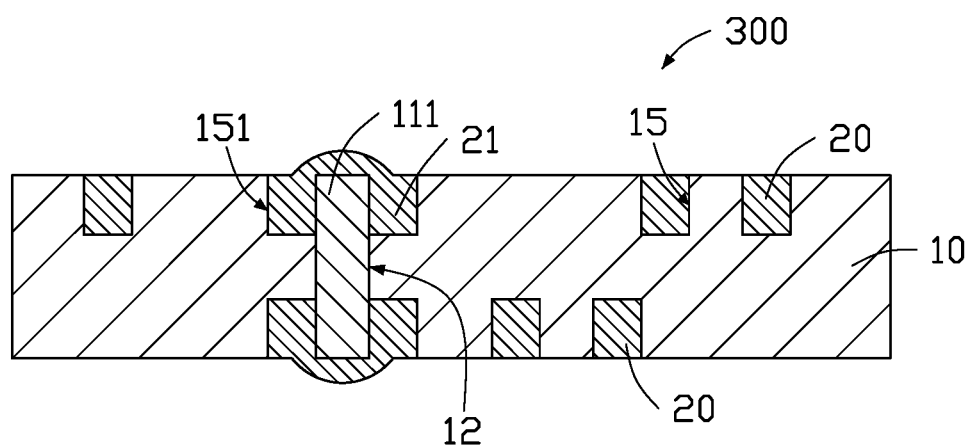
FIG. 13 is a cross-sectional view of a circuit board according to the second embodiment and a fourth embodiment of the present disclosure.

Referring to FIG. 11 to FIG. 13, a second embodiment of the present disclosure of a method for manufacturing a circuit board includes:

In the first step, referring to FIG. 11, a substrate 10 is provided, and a hole is formed in the substrate 10 to form a through hole 11.

In the second step, the through hole 11 is filled with a conductor 111 to form a conductive hole 12.

In the third step, two peelable films 13 are provided to cover opposite sides of the substrate 10.

In the fourth step, referring to FIG. 12, a groove 15 is formed in each of the opposite sides of the substrate 10 and each of the two peelable films 13 by laser ablation.

The groove 15 includes a concave portion 151. The concave portion 151 is located at the conductive hole 12, and the diameter of the concave portion 151 is larger than the diameter of the conductive hole 12.

In the fifth step, a surface treatment is performed on a side wall and a bottom wall of each of the two grooves 15 to increase roughness.

In the sixth step, the two peelable films 13 are removed.

In the seventh step, a seed layer is formed on the side wall and bottom wall of each of the two grooves 15.

In the eighth step, referring to FIG. 13, a circuit layer 20 is formed in each of the two grooves 15 to obtain a circuit board 300.

Each of the circuit layers 20 includes a connection pad 21 located in the concave portion 151. The shape of the connection pad 21 is a conductive protrusion, and the two circuit layers 20 are electrically connected through the conductor 111.

FIG. 10 is a third embodiment of the present disclosure of the circuit board 200. The circuit board 200 includes at least two stacked circuit board units 100. Each of the circuit board units 100 includes a substrate 10 and a circuit layer 20.

The substrate 10 has a conductive hole 12 penetrating therethrough. A conductor 111 is provided in the conductive hole 12.

A groove 15 is provided on one side of the substrate 10. The groove 15 includes a concave portion 151. The concave portion 151 is located at the conductive hole 12, and the diameter of the concave portion 151 is larger than the diameter of the conductive hole 12 to form a stepped hole structure, to expose a portion of the conductor 111.

The circuit layer 20 is located in the groove 15. The circuit layer 20 includes a connection pad 21 located in the concave portion 151. The shape of the connection pad 21 is a conductive protrusion. The connection pad 21 surrounds and is electrically connected to the conductor 111.

In this embodiment, a metallization layer 22 is provided on the surface of the circuit layer 20. The metallization layer 22 is a metal such as tin or silver.

FIG. 13 is a fourth embodiment of the circuit board 300 of the present disclosure. The circuit board 300 includes a substrate 10 and two circuit layers 20 disposed on both sides of the substrate 10.

The substrate 10 has a conductive hole 12 penetrating therethrough. A conductor 111 is provided in the conductive hole 12.

The substrate 10 is provided with a groove 15 on both sides. The groove 15 includes a concave portion 151. The concave portion 151 is located at the conductive hole 12, and the diameter of the concave portion 151 is larger than the diameter of the conductive hole 12.

Each of the two circuit layers 20 is disposed in a corresponding one of the grooves 15. Each of the two circuit layers 20 includes a connection pad 21 located in the concave portion 151. The two circuit layers 20 are electrically connected through the conductor 111.

The manufacturing method of the circuit board of the present disclosure is relatively simple and the manufacturing cost is low. The circuit of the manufactured circuit board 200/300 is formed in the groove 15, and the groove 15 is formed by laser ablation, therefore, the line thickness of the circuit layer 20 is stable and the precision is higher. The connection pad 21 of the circuit board 200/300 of the present disclosure is a conductive protrusion to improve the conductive yield.

In addition, those skilled in the art can also make other changes within the spirit of the present disclosure. Of course, these changes made in accordance with the spirit of the present disclosure should be included in the scope claimed by the present disclosure.

What is claimed is:

1. A circuit board manufacturing method comprising: providing
    (1) providing a substrate, and making a hole in the substrate to form a through hole;
    (2) filling the through hole with a conductor to form a conductive hole;
    (3) providing a peelable film to cover one side of the substrate;
    (4) forming a groove in the peelable film and the substrate by laser ablation, the groove comprising a concave portion, the concave portion located at the conductive hole, and a diameter of the concave portion being larger than a diameter of the conductive hole to expose a portion of the conductor;
    (5) performing a surface treatment on a side wall and a bottom wall of the groove to improve roughness;
    (6) removing the peelable film;

(7) forming a seed layer on the side wall and the bottom wall of the groove;

(8) making a circuit layer in the groove to obtain a circuit board unit, the circuit layer comprising a connection pad located in the concave portion, the connection pad shaped as a conductive protrusion which surrounds and is electrically connected to the conductor;

(9) repeating step (1) to step (8) at least once; and

(10) laminating at least two of the circuit board units.

2. The circuit board manufacturing method according to claim 1, wherein: in step (5), the side wall and the bottom wall of the groove are processed by a plasma surface treatment machine.

3. The circuit board manufacturing method according to claim 1, wherein: in step (7), the seed layer is formed by chemical vapor deposition or physical vapor deposition.

4. The circuit board manufacturing method according to claim 1, wherein: after step (8) and before step (9), the method further comprises a step of forming a metallization layer on a surface of the circuit layer.

5. The circuit board manufacturing method according to claim 1, wherein: in step (1), one side of the substrate is connected to a carrier board through a separable film.

* * * * *